INVENTOR
RUFUS L. COOK
BY
[signature]
[signature]
ATTYS.

INVENTOR.
RUFUS L. COOK
BY
Rolla N. Carter
Don D. Doty
ATTYS.

1

3,436,676
BROADBAND POWER AMPLIFIER
Rufus Lee Cook, Panama City, Fla., assignor to the United States of America as represented by the Secretary of the Navy
Filed Nov. 4, 1965, Ser. No. 506,906
Int. Cl. H03f 3/02, 3/68
U.S. Cl. 330—117 10 Claims

ABSTRACT OF THE DISCLOSURE

A broadband power amplifier having an input voltage regulation circuit, a phase inverter and linearity control circuit for converting the adjustable input voltage into a pair of oppositely phased electric signals, a pair of amplifiers for respectively amplifying said pair of electrical signals to a more useful level, a pair of balance gain control circuits for equalizing said pair of oppositely phased electrical signals, a pair of sets of five parallel power amplifiers for further amplifying said pair of equalized oppositely phased electrical signals to a more useful power level, respectively, and an output transformer connected to the outputs of said pair of sets of five parallel power amplifiers.

The invention described herein may be manufactured and used by or for the Government of the United States of America for governmental purposes without the payment of any royalties thereon or therefor.

The present invention relates generally to electronic power amplifiers and in particular is a wide frequency band, linear, high power amplifier having a relatively flat frequency response curve within the 10 kilocycles per second to 2.3 megacycles per second frequency range and will operate satisfactorily in either the continuous (CW) or pulse modes.

In the past, both single tube power output stages and conventional double-tube push-pull power output stages have been used with considerable success for many practical applications. However, for most of such applications, the useful power provided by prior art amplifiers is severely limited to a relatively narrow frequency band and, therefore, the overall fidelity thereof is considered reduced, when a broad frequency response is required. Also, in the single output tube type power amplifier, the second harmonic distortion existing in the output thereof is ordinarily of an amount that is sufficient to restrict its use considerably. And in the push-pull type power amplifier, the odd harmonics may become appreciable and thereby also cause objectionable distortion to occur in the output thereof. Where such distortion was encountered, remedial prior art design required that the load resistance of the output transformer secondary winding be increased, but this, of course, sacrificed output power. Furthermore, in a push-pull power amplifier, the plate-to-plate impedance is quite high which, in turn, necessitates using a high turns-ratio between the primary and secondary windings of the output transformer, in order to provide the proper impedance matching with a load having a low impedance input. It, therefore, naturally follows, that the frequency range of a conventional push-pull amplifier is directly proportional to the bulk (that is, the volume and weight) of the output transformer; and where such bulk becomes great enough to be undesirable, restrictive, or prohibitive as far as space and weight considerations are concerned, at that point the upper operational frequency range of the amplifier is adversely limited.

For many practical purposes, the instant invention overcomes most of the disadvantages of the power amplifiers of the prior art. Accordingly, as will become evident from

2 the description thereof presented below, for such purposes, it is considered to be superior thereto.

It is, therefore, an object of this invention to provide an improved electrical power amplifier.

Another object of this invention is to provide a high power amplifier having a broad frequency band.

Still another object of this invention is to provide a power amplifier having substantially no adverse harmonic distortions in the output thereof.

Still another object of this invention is to provide a power amplifier having improved system balance, frequency response, and amplification fidelity.

A further object of this invention is to provide a power amplifier which operates on the more linear portion of its characteristic curve.

A further object of this invention is to provide a push-pull power amplifier which facilitates impedance matching with a low impedance load by incorporation of a relatively small, compact, low turns-ratio audio output transformer therein.

Another object of this invention is to provide a power amplifier which may be pulsed or operated continuously, thereby increasing the possible applications thereof.

Another object of this invention is to provide a high power, broadband power amplifier that may be easily and economically manufactured, operated, and maintained.

Other objects and many of the attendant advantages will be readily appreciated as the subject invention becomes better understood by reference to the following detailed description when considered in conjunction with the accompanying drawings wherein.

Figure 1:
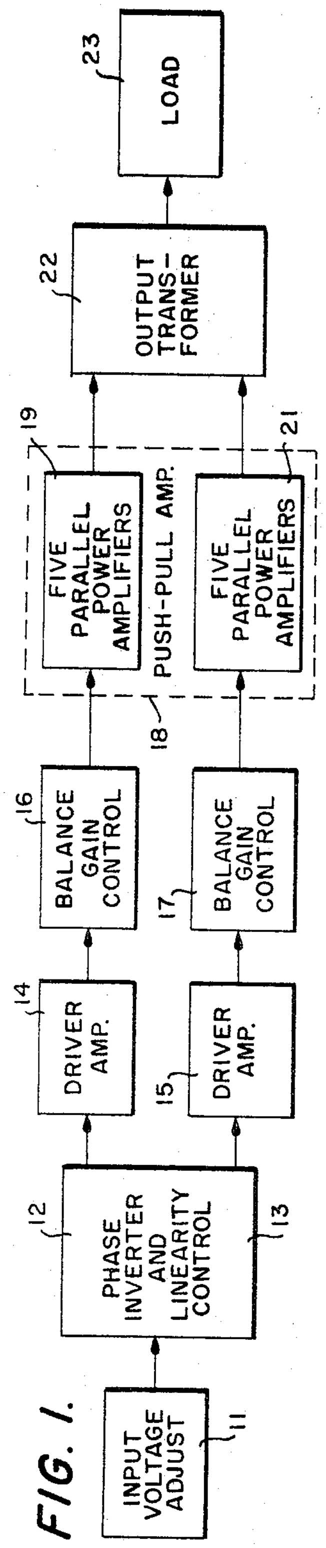
FIG. 1 is a block diagram representation of a preferred embodiment of the power amplifier constituting this invention.

Referring now to FIG. 1, the subject invention 10 is shown as having an input voltage necessary for optimum amplifier operation to be manually selected. The output of input voltage adjust 11 is coupled to a phase inverter stage 12 having a linearity control 13 incorporated therein. The outputs thereof are, of course, 180 degrees out of phase with respect to each other and are respectively connected to the inputs of driver amplifiers 14 and 15. In turn, the outputs of driver amplifiers 14 and 15 are respectively connected through balance gain controls 16 and 17 to the inputs of a unique push-pull amplifier stage 18 incorporating a "push" set of five parallel connected amplifiers 19 which are connected in push-pull arrangement with a "pull" set of five parallel connected amplifiers 21. It would appear to be noteworthy at this time that five and only five power amplifier tubes may be connected in parallel in each of the aforesaid "push" and "pull" sets of amplifiers if the exact unique operational results claimed for this invention are to be obtained. Hence, if the particular power, linearity, fidelity, and frequency range defined subsequently in greater detail in the discussion of the operation of this invention are to be obtained, power amplifier 18 must contain two sets of five parallel connected power amplifier tubes connected in push-pull arrangement. Experimental test and calibration of this invention has, of course, provided the evidence for this statement. On the other hand, experimentation has also indicated that more or less than five amplifier tubes may be used in each of said "push" and "pull" sets, if results of lesser quality and quantity are acceptable for some particular application. However, the point of diminishing returns is reached immediately on either side of the five tube arrangement and, thus, the use of, say, four or six tubes causes the quality and usefulness of this invention to fall off rapidly. Therefore, in order to meet the rigid operational standards hereinafter set forth, the disclosed preferred embodiment of this device should be construed as being the optimum structural embodiment of this invention and the only one that will actually meet said standards.

The outputs of each of said push-pull sets of power amplifiers 19 and 21 are coupled to the respective inputs of an output transformer 22, the output of which is coupled to any appropriate utilization apparatus or load 23.

Figure 2:
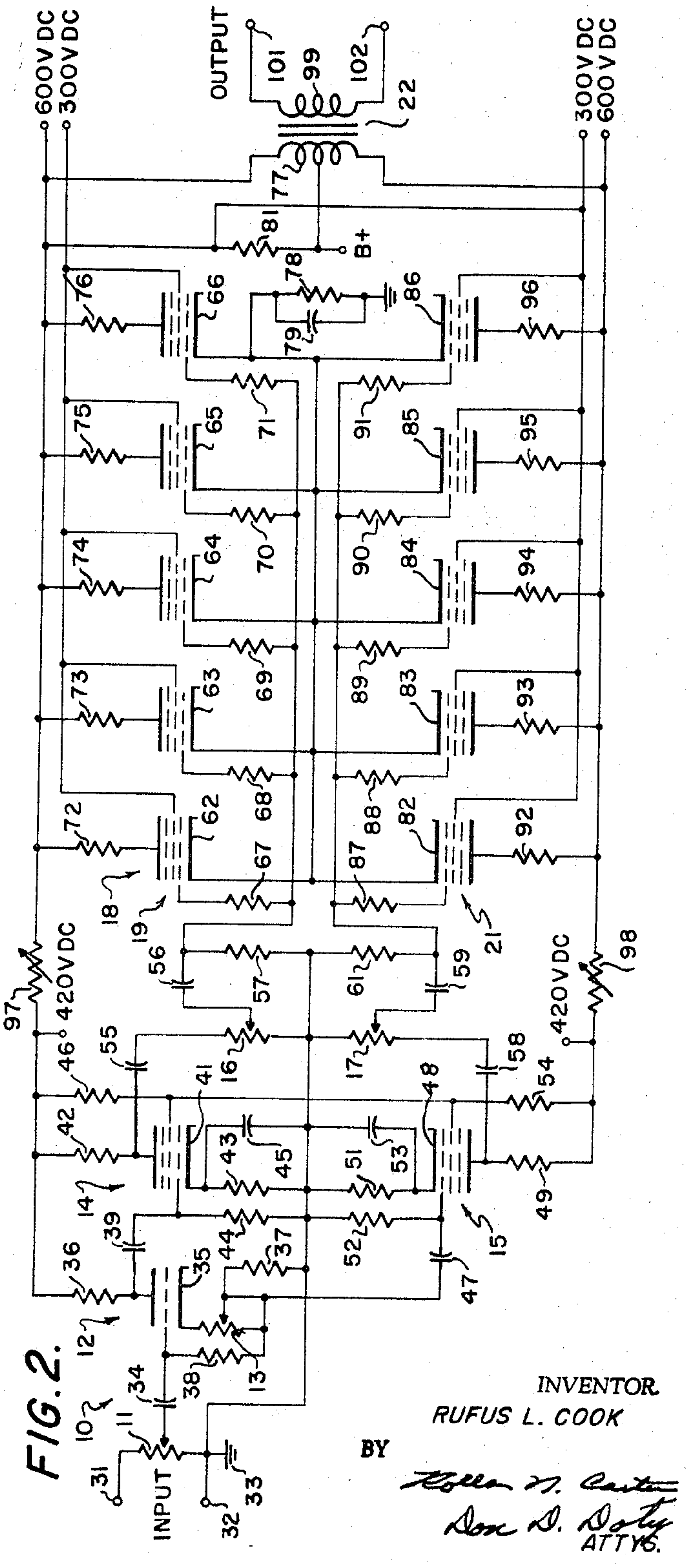
FIG. 2 is a detailed electrical schematic diagram of the subject invention embodiment depicted in block form in FIG. 1.

The detailed schematic diagram of FIG. 2 depicts the subject invention 10 as having a pair of input terminals 31 and 32 connected across the resistance portion of a potentiometer which, in fact, is the aforementioned input voltage adjust 11. Terminal 32 is also connected to a ground 33 which, of course is the ground for the entire power amplifier circuit.

The movable arm of potentiometer 11 is coupled through a .001 $\mu$f. coupling capacitor 34 to the control grid of a 6SN7 triode tube 35 located in the aforesaid phase inverter stage 12. The plate of triode 35 is coupled through a 100,000 ohm resistor 36 to a positive direct current voltage of the order of 420 volts, and the cathode thereof is coupled through a pair of series connected resistors 13 and 37 to said ground. As may readily be seen, resistor 13 is a variable resistor which performs the function of providing manual linearity control within the aforementioned phase inverter 12. It is actually a 25,000 ohm variable resistor, and the aforesaid resistor 37 to which it is series joined in a 100,000 ohm resistor. A 2.2 megohm biasing resistor 38 is connected between the control grid of triode 35 and the common junction of resistors 13 and 37.

Phase inverter 12 has two outputs, each of which is 180 degrees out of phase with the other. One such output is taken from the plate of triode 35 and the other is taken from said common junction of resistors 13 and 37. Hence, in the first mentioned instance, the plate of triode 35 is coupled through a .001 $\mu$f. coupling capacitor 39 to the control grid of a 6550 pentode tube 41 located in the aforementioned driver amplifier stage 14. The plate of pentode 41 is connected through a 1500 ohm resistor 42 to the aforesaid 420 volt direct current positive potential, and the cathode thereof is connected through a 138 ohm resistor 43 to ground. A 1 megohm biasing resistor 44 is connected between the control grid of pentode 41 and ground, and a .050 $\mu$f. by-pass capacitor 45 is connected in parallel with cathode resistor 43. The screen grid of pentode 41 is coupled through a 16,000 ohm resistor 46 to the aforesaid 420 volt positive direct current voltage, and the suppressor grid thereof is conventionally connected to the cathode thereof.

The second output of phase inverter 12 is taken from the common junction of resistors 13 and 37 and is coupled through a .001 $\mu$f. capacitor 47 to the control grid of a 6550 pentode tube 48. The plate thereof is coupled through a 1500 ohm resistor 49 to a positive 420 volt direct current potential, and the cathode thereof is coupled through a 138 ohm resistor 51 to ground. A 1 megohm biasing resistor 52 is connected between the control grid thereof and ground, and a .050 $\mu$f. capacitor 53 is connected in parallel with cathode resistor 51. The screen grid of pentode 48 is connected through a 16,000 ohm resistor 54 to the screen grid of pentode 41 and to the aforesaid 420 volt direct current voltage.

The output of driver amplifier 14 is taken from the plate of pentode 41 and is coupled through a .001 $\mu$f. coupling capacitor 55 to one terminal of the resistance portion of balance gain control 16 which, in fact in this particular case, is a 1 megohm potentiometer. The other terminal of the resistance portion of potentiometer 16 is connected to ground. The movable arm thereof is then coupled through another .001 $\mu$f. capacitor 56 to one of the inputs of the aforementioned push-pull amplifier 18. A 1 megohm biasing resistor 57 for the five parallel connected amplifier 19 incorporated therein interconnects the output side of capacitor 56 and ground.

The output of driver amplifier 15, is likewise, taken from the plate of pentode 48 and is coupled through a .001 $\mu$f. coupling capacitor 58 to one terminal of the resistance portion of balance gain control 17 which, in fact in this instance, is also a 1 megohm potentiometer. The other terminal of the resistance portion of potentiometer 17 is connected to ground. The movable arm thereof is coupled through a .001 $\mu$f. capacitor 59 to the other of the inputs of push-pull amplifier 18, and a 1 megohm biasing resistor 61 for the five parallel connected amplifiers 21 incorporated therein is connected between the output plate of capacitor 59 and ground.

Parallel power amplifiers 19 actually contains five 6550 pentode power amplifier tubes 62 through 66. The conrol grids thereof are respectively interconnected through five 470 ohm grid resistors 67 through 71, and their interconnection is then coupled to the output side of the aforementioned coupling capacitor 56. The plates thereof are, likewise, respectively interconnected through five 22 ohm plate resistors 72 through 76, and their interconnection is then connected to one terminal of a primary winding 77 of output transformer 22 and, thus, effectively to a positive direct current B+ voltage of the order of 600 volts which is coupled to a center-tap thereof. The cathodes of pentodes 62 through 66 are interconnecter and connected to ground through a 38 ohm common cathode resistor 78, which, in turn, has a 0.25 $\mu$f. bypass capacitor 79 paralleled therewith. The screen grids thereof are interconnected and coupled through a 16,000 ohm common screen resistor 81 to the aforesaid 600 volt B+ voltage.

As may readily be seen from FIG. 2 and the foregoing circuit description, the five power amplifier stages 19 containing the five pentode tubes 62 through 66 and associated circuitry are connected in electrical parallel. The fact that this is a very important factor in the successful performance of this invention will be discussed more fully below.

Parallel power amplifiers 21 contain five 6550 pentode power amplifier tubes 82 through 86. The control grids thereof are respectively interconnected through five 470 ohm resistors 87 through 91, and said interconnection is then coupled to the output side of the aforementioned coupling capacitor 59. The plates thereof are respectively interconnected through fixe 22 ohm plate resistors 92 through 96 and said interconnection is then connected to the other terminal of primary winding 77 of output transformer 22 and, consequently, effectively connected to the aforesaid B+ voltage, as a result of its being coupled to the center-tap thereof. The cathodes of pentodes 82 through 86 are interconnected, connected to the interconnected cathodes of pentodes 62 through 66, and thus through the aforesaid common cathode resistor 78 to ground. The screen grids thereof are interconnected, connected to the screen grids of pentodes 62 through 66, and thus connected through the aforesaid common screen resistor 81 to B+ voltage.

Again, as may readily be seen from FIG. 2 and the foregoing circuit description, the five power amplifier stages 21 containing the five pentode tubes 82 through 86 and associated circuitry are connected in electrical parallel. In addition, it may readily be seen that they are connected in push-pull arrangement with the five pentode tubes of power amplifiers 19. As previously suggested, these particular structural configurations, of course, play very important parts in the overall operation of this invention.

All of the 6550 pentode tubes incorporated in push-pull amplifier 18 should be considered as having their suppressor grids connected to their cathodes, respectively.

The aforementioned 420 volt positive direct current voltages which act as the plate voltage of phase inverter 12 and driver amplifiers 14 and 15 may be supplied by any selected suitable source, if so desired, inasmuch as making such selection would be well within the purview of one skilled in the art having the benefit of the teachings herewith presented. However, it has been found expedient to use a pair of variable voltage dropping resistors 97 and 98 which are effectively connected to the 600 volt B+ voltage for the purpose of dropping it to the required 420 volts DC.

The output of this invention is supplied by a secondary winding 99 of output transformer 22. In order to provide the optimum impedance matching between push-pull amplifier 18 and a nominal impedance load of, say, 100 ohms, a 3.16 to 1 turns ratio should preferably be designed into output transformer 22. The utilization apparatus such as load 23 or the like is, of course, connected to a pair of output terminals 101 and 102 which are, in turn, coupled to the aforesaid transformer secondary winding 99. Although indicated in a conventional manner symbolically in FIG. 2, in actual practice, transfomer 22 is preferably a toroidal wound transformer.

Figures 3, 4, 5:
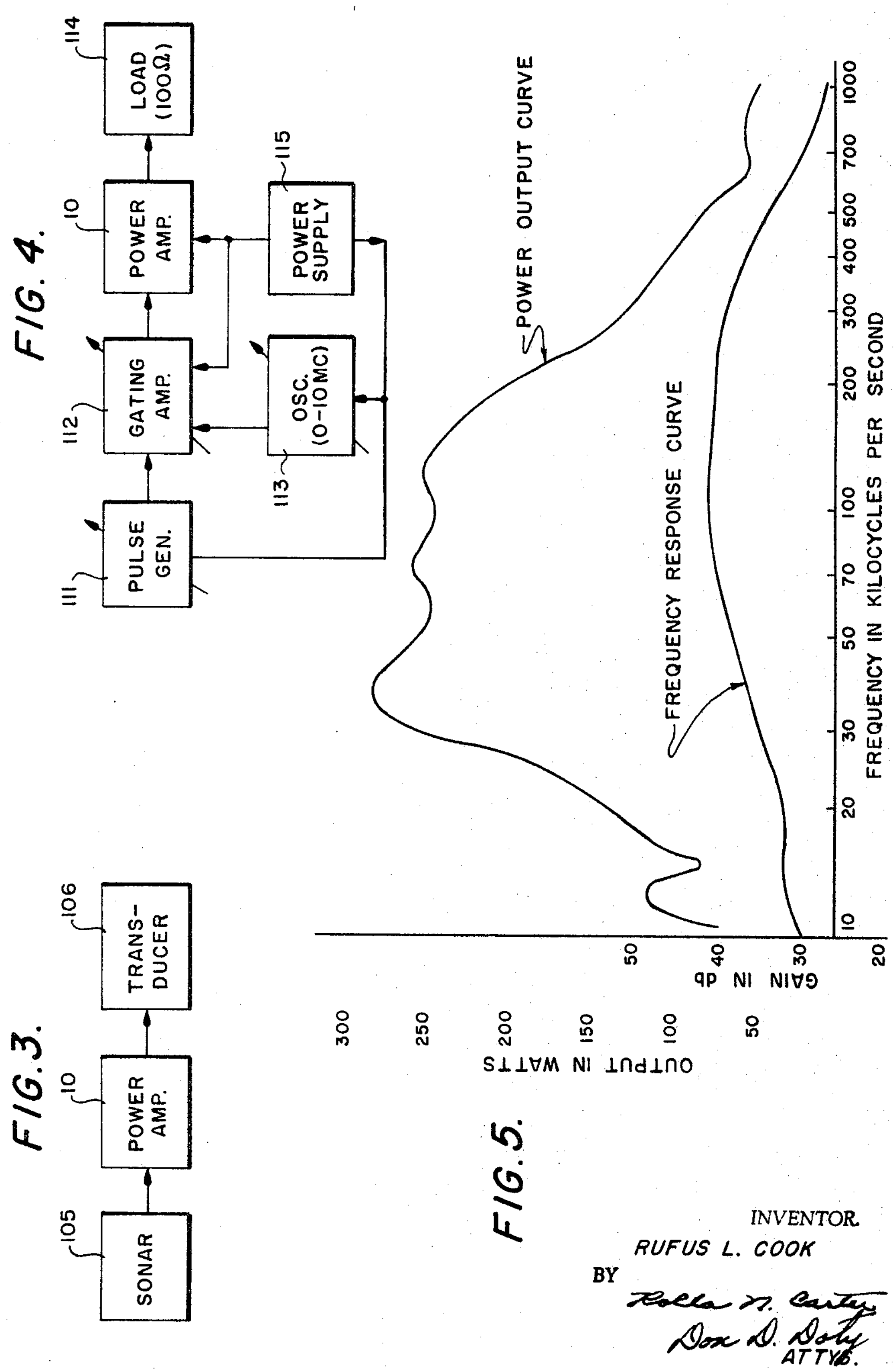
FIG. 3 is a block diagram of a representative system which may incorporate the subject invention to an advantage.
FIG. 4 is a block diagram of an exemplary system that may be used to calibrate the subject invention.
FIG. 5 is a graphical representation of the power output and frequency response curves obtainable from the invention.

FIG. 3 discloses an exemplary system in which the power amplifier constituting this invention may be used to an advantage. A sonar 105 has its output coupled to the input of the subject power amplifier 10, and then the output thereof is, in turn, coupled to the input of an appropriate transducer 106. Of course, other types of utilization apparatus may be suitably associated with power amplifier 10, but for the purpose of this disclosure, the foregoing is considered to be typical and representative.

FIG. 4 represents a system which may be used for the purpose of calibrating this invention, and it is herewith presented as evidence of the manner in which the exceptional power output and frequency response curves of FIG. 5 have been obtained. It includes an adjustable variable width pulse generator 111, with the output thereof coupled to one of the inputs of an adjustable variable gating amplifier 112. The other input of gating amplifier 112 is connected to the output of an adjustable zero to ten megacycles per second oscillator 113, and the output thereof is coupled to the input of the subject power amplifier 10. A one hundred ohm load 114 (which may or may not be identical to load 23 of FIG. 1) is connected to the output of power amplifier 10. A power supply 115 is conventionally connected to pulse generator 111, gating amplifier 112, oscillator 113, and power amplifier 10, in order to supply their respective power requirements. Of course, any suitable instrumentation (not shown) may be connected at various and sundry suitable points of this calibration system for taking the necessary measurements to obtain or calculate the aforementioned power output and frequency response curves.

The operation of the invention will now be discussed briefly in connection with all of the figures.

The input signal to be amplified is, of course, an electrical signal, and it may either be a pulse signal of fifty microseconds duration or more, or it may be a continuous wave (CW) occurring within the 10 kilocycles per second to 2.3 megacycles per second frequency range. This is the signal that is applied to input terminals 31 and 32 of the detailed schematic embodiment of FIG. 2. The level thereof that is proper or optimum for further amplification is manually controlled by and taken from variable potentiometer 11, inasmuch as it acts as the input voltage adjust. The voltage taken therefrom is coupled through coupling capacitor 34 to the grid of triode tube 35 of phase inverter 12. As said voltage is applied to triode 35, a voltage will develop across resistors 36 and 37 which will be nearly equal in amplitude and 180 degrees out of phase with respect to ground. Variable resistor 13 acts as the linearity control because it is uniquely applied in this case in such manner that it serves along with resistor 38 as a bias resistor for the grid of triode 35 and, thus, can be manually set to compensate for any amplitude distortion, when excessively high level signals are applied to the subject amplifier.

The two relatively inverted output voltages from phase inverter stage 12 are respectively taken from the plate of triode 35 and from the movable arm of linearity control potentiometer 13. They are coupled through capacitors 39 and 47 to the grids of pentodes 41 and 48 in driver amplifiers 14 and 15, respectively. Resistors 44 and 52 are grid leak resistors. Pentodes 41 and 48 are identical in every respect and are used in this particular case as voltage amplifiers. Accordingly, only pentode 41 of driver amplifier 14 will herewith be discussed in order to simplify this disclosure, with the understanding that the circuitry of driver amplifier 15 is comparable thereto. A positive B+ voltage of the order of 420 volts is applied through plate load resistor 42 to the plate of pentode 41, and a screen voltage of the order of 300 volts is obtained from voltage dropping resistor 46. Cathode resistor 43 is used to bias pentode 41 to a discrete operating point on its characteristic curve, and capacitor 45 is used for alternating current by-passing in the cathode circuit.

As the control grid signal of pentode 41 varies in amplitude, the current flow therethrough changes accordingly, and this current variation through plate load resistor 42 causes, in turn, an alternating voltage to be coupled through coupling capacitor 55 across the movable arm of potentiometer 16 may be manually adjusted, the voltage picked off therefrom may be controlled; and because balance gain control potentiometer 17 operates in exactly the same way, the driver amplifiers 14 and 15 may both be adjusted to make their output voltages equal and, therefore, in a balance. These particular voltage balancing functions are of considerable importance and value, since they considerably improve the linearity of the driver amplifier stages and, thus, contribute considerably to the linearity of the overall invention itself. The manner in which they are effected appears to be unique as far as electrical circuitry is concerned and, of course, the foregoing described combination of elements causes them to occur.

Capacitor 56 is used to couple the aforesaid preset balanced voltage from balance gain control potentiometer 16 to direct current grid leak resistor 57 and then to the input of parallel amplifier 19, and capacitor 59 is used to couple the preset balanced voltage from balance gain control potentiometer 17 to direct current grid leak resistor 61 and then to the input of parallel amplifiers 21.

Amplifier 19 contains five pentode stages which are connected in electrical parallel. Therefore, the aforesaid balanced voltage, after passing through their respective grid resistors 67 through 71, are simultaneously applied to the control grids of pentodes 62 through 66. B+ voltage of the order of 600 volts is obtained through the primary winding 77 of transformer 22, and it is applied through resistors 72 through 76 to the plates of pentodes 62 through 66. Grid resistors 67 through 71 and plate resistors 72 through 76 are of such value and are used primarily to eliminate all parasitic oscillations in the output of this group of parallel pentodes. Screen voltages of approximately 300 volts are supplied to all pentodes through voltage dropping resistor 81.

As the amplitude of the signal voltage is varied at the control grids of pentodes 62 through 66, an electron current flow is propagated from ground through by-passed resistor 78 to the cathodes of each thereof at the same time, through the tubes themselves, through the plate load resistors, and to and through the primary winding of output transformer 22. These tubes, of course, each provide amplification, but, because of this unique circuit arrangement, the plate-to-plate resistance thereof is lowered by a factor of 10 and, thus, permits an optimum operating point to be selected on the more linear portion of its characteristic curve. Hence, the frequency response is relatively flat over a broad frequency band and the total power output is quite high.

If the foregoing five parallel power amplifiers 19 are defined as the "push" set of amplifiers, then five parallel power amplifiers 21 may be defined as the "pull" set of amplifiers. Obviously, the various pentodes and their respective associated elements of amplifiers 21 operate in exactly the same manner that amplifiers 19 operate. Moreover, amplifiers 19 and 21 are obviously connected in push-pull arrangement, as that term is conventionally defined in the power amplifier art.

Output transformer 22 is effectively and appropriately connected to the plate outputs of parallel amplifiers 19 and 21, and it combines them in such manner that no even harmonics will be present in the secondary winding thereof. It has also been ascertained that paralleling the push and pull amplifier tubes as herein disclosed and as heretofore described reduces the requirements of the output transformer. This is brought about because it allows the turns ratio of the output transformer to be very low (3.16 to 1) and still provide a proper impedance match to a low impedance load of, say, 100 ohms or thereabouts. Although numerous output transformers having the proper turns ratio will operate satisfactorily in this invention, it has been found that a bifilar winding mounted on a toroidal type core provides optimum operation, in that it performs well during either pulse or continuous wave operation.

Since the system of FIG. 3 is merely a representation of one of many possible applications of this invention, it is very simply portrayed. Although its operation is believed to be obvious, in order to insure the understanding thereof, it is herewith indicated that the subject invention 10 receives the electrical output signal from sonar 105, amplifies it to a more useful power level, and drives electroacoustical or other appropriate transducer 106 at said power level.

The device of FIG. 4 also operates in a simple manner. Pulse generator 111 produces a pulse signal of any predetermined width which is used to control the opening and closing of the gate of gating amplifier 112. When open, whatever frequency signal is selected at oscillator 113 passes through gating amplifier 112 to power amplifier 10, this invention. After being amplified thereby, it is supplied to one hundred ohm load 114. Power supply 115, of course, supplies power at whatever voltage and current levels are necessary to any or all of the elements of this system.

Measurement of frequencies, voltages, and currents, etc., at suitable input and output points provides sufficient data to plot the power output and frequency response curves depicted in FIG. 5.

Inspection of FIG. 5 will disclose that the frequency response is relatively flat over the 10 to 1000 kilocycle per second frequency range, and that the power output within said frequency range is very high—very high indeed—for such broadband operation. However, it has been determined from experimental use that this frequency range may be extended to 2.3 megacycles per second, and that satisfactory power amplification may be obtained thereat.

If so desired, to improve the upper frequency range, conventional high frequency compensation design techniques may be applied to this invention, inasmuch as so doing would be well within the purview of one skilled in the art having the benefit of the teachings herewith presented.

What is claimed is:

1. A power amplifier comprising in combination:
means for receiving and adjusting an input electrical signal to a predetermined voltage level;
means, including an adjustable linearity control means connected to the output of said input signal voltage adjusting means for converting said voltage adjusted input signal to a pair of equal and oppositely phased electrical signals;
means effectively connected to the outputs of said converting means for adjusting and equalizing the pair of oppositely phased electrical signals therefrom;
a first plurality of parallel connected power amplifiers connected to the aforesaid adjusting and equalizing means for power amplifying one of said pair of oppositely phased electrical signals;
a second plurality of parallel connected power amplifiers connected to the aforesaid adjusting and equalizing means for power amplifying the other of said pair of oppositely phased electrical signals; and
transformer means having a primary winding and a secondary winding, with the primary winding thereof conected between the outputs of said first and second pluralities of parallel connected power amplifiers.

2. A power amplifier comprising in combination:
an input voltage adjust;
a triode tube having a control grid, a cathode, and a plate, with the control grid thereof effectively connected to the output of said input voltage adjust;
a first positive direct current voltage;
a ground;
a first fixed resistor coupled between the plate of said triode tube and said first positive direct current voltage;
a variable linearity control resistor connected to the cathode of said triode tube;
a second fixed resistor connected between said variable linearity control resistor and said ground;
a third fixed resistor coupled between the control grid of said triode tube and the common junction of said variable linearity control resistor and said second fixed resistor;
a first driver amplifier effectively coupled to the plate output of said triode tube;
a second driver amplifier effectively coupled to the common junction of said variable linearity control resistor and said second fixed resistor;
a first set of five parallel connected power amplifiers effectively coupled to the output of said first driver amplifier;
a second set of five parallel connected power amplifiers effectively coupled to the output of said second driver amplifier;
an output transformer having a primary winding including a center tap and a secondary winding, with the primary winding thereof connected between the outputs of said first and second sets of five parallel connected amplifiers, and with the secondary winding thereof adapted for being connected to a load; and
a second positive direct current voltage connected to the center tap of the primary winding of the aforesaid output transformer.

3. The device of claim 2 wherein said input voltage adjust comprises:
a pair of electrical terminals adapted for receiving an electrical input signal; and
a potentiometer having a resistance portion and a manually adjustable slidable arm in contact therewith, with the resistance portion thereof coupled between said pair of electrical terminals, and the slidable arm adapted for acting as the output thereof.

4. The device of claim 2 wherein said triode tube is a 6SN7 vacuum tube.

5. The device of claim 2 wherein said first and second driver amplifier each includes a 6550 pentode vacuum tube.

6. The device of claim 2 wherein each of the five parallel connected power amplifiers of each of said first and second sets of five parallel connected power amplifiers includes a 6550 pentode vacuum tube.

7. The device of claim 2 wherein said output transformer is a bifilar wound toroidal transformer with a 3.16 to 1 turns ratio.

8. The invention according to claim 2 further characterized by a pair of balance gain controls respectively coupled between the output of said first driver amplifier and the input of said first set of five parallel connected power amplifiers and the output of said second driver amplifier and the input of said second set of five parallel connected power amplifiers.

9. A power amplifier comprising in combination:

an input voltage adjust;

a triode tube having a control grid, a cathode, and a plate, with the control grid thereof effectively connected to the output of said input voltage adjust;

a positive direct current voltage;

a ground;

a first fixed resistor coupled between the plate of said triode tube and said positive direct current voltage;

a variable linearity control resistor having a pair of terminals, with one of the terminals thereof connected to the cathode of said triode tube;

a second fixed resistor connected between the other terminal of said variable linearity control resistor and said ground;

a third fixed resistor coupled between the control grid of said triode tube and the common junction of said other terminal of the aforesaid variable linearity control resistor and said second fixed resistor;

a first driver amplifier effectively coupled to the plate output of said triode tube;

a second driver amplifier effectively coupled to the common junction of said variable linearity control resistor and said second fixed resistor;

a first variable balance gain control coupled to the output of said first driver amplifier;

a second variable balance gain control coupled to the output of said second driver amplifier;

a first set of five parallel connected power amplifiers connected to the output of said first variable balance gain control;

a second set of five parallel connected power amplifiers connected to the output of said second variable balance gain control; and a toroidal output transformer having a primary winding and a secondary winding, with the primary winding thereof connected between the outputs of said first and second sets of five parallel connected amplifiers, and with the secondary winding thereof adapted for being connected to an electrical load.

10. A power amplifier consisting of:

an input voltage adjust;

a triode tube having a control grid, a cathode, and a plate, with the control grid thereof effectively connected to the output of said input voltage adjust;

a first positive direct current voltage;

a ground;

a first fixed resistor coupled between the plate of said triode tube and said first positive direct current voltage;

a variable linearity control resistor connected to the cathode of said triode tube;

a second fixed resistor connected between said variable linearity control resistor and said ground;

a third fixed resistor coupled between the control grid of said triode tube and the common junction of said variable linearity control resistor and said second fixed resistor;

a first driver amplifier effectively coupled to the plate output of said triode tube;

a second driver amplifier effectively coupled to the common junction of said variable linearity control resistor and said second fixed resistor;

a first balance gain control coupled to the output of said first driver amplifier;

a second balance gain control coupled to the output of said second driver amplifier;

a first set of five parallel connected power amplifiers connected to the output of said first balance gain control;

a second set of five parallel connected power amplifiers connected to the output of said second balance gain control;

a toroidal output transformer having a center tapped primary winding and a secondary winding wound in bifilar configuration, with the primary winding thereof connected between the outputs of said first and second sets of five parallel connected amplifiers, and with the secondary winding thereof adapted for being connected to an electrical load; and a second positive direct current voltage connected to the center tap of the primary winding of the aforesaid toroidal output transformer.

References Cited

UNITED STATES PATENTS

| | | | |
|---|---|---|---|
| 2,825,766 | 3/1958 | Corderman | 330—117 |
| 2,844,777 | 7/1958 | Ross | 330—117 X |
| 3,011,025 | 11/1961 | Sullivan | 330—117 X |

NATHAN KAUFMAN, *Primary Examiner.*

U.S. Cl. X.R.

330—124